US012761289B2

(12) United States Patent
Couch et al.

(10) Patent No.: US 12,761,289 B2
(45) **Date of Patent: *Oct. 13, 2026**

(54) LEAKAGE DETECTION FOR CABLE TV SYSTEMS WITH UPSTREAM SIGNALS ABOVE 118 MHz

(71) Applicant: ComSonics, Inc., Harrisonburg, VA (US)

(72) Inventors: Ken Couch, Harrisonburg, VA (US); Joseph Early, Harrisonburg, VA (US); Peter Jensen, Harrisonburg, VA (US)

(73) Assignee: ComSonics, Inc., Harrisonburg, VA (US)

( * ) Notice: Subject to any disclaimer, the term of this patent is extended or adjusted under 35 U.S.C. 154(b) by 58 days.

This patent is subject to a terminal disclaimer.

(21) Appl. No.: 18/826,389

(22) Filed: Sep. 6, 2024

(65) Prior Publication Data

US 2024/0426944 A1 Dec. 26, 2024

Related U.S. Application Data

(63) Continuation of application No. 17/938,389, filed on Oct. 6, 2022, now Pat. No. 12,130,340, which is a continuation-in-part of application No. 17/151,643, filed on Jan. 18, 2021, now Pat. No. 11,496,182.

(60) Provisional application No. 62/975,495, filed on Feb. 12, 2020, provisional application No. 62/971,407, filed on Feb. 7, 2020, provisional application No. 62/963,585, filed on Jan. 21, 2020.

(51) Int. Cl.

| | |
|---|---|
| ***G01R 31/52*** | (2020.01) |
| ***G01R 31/58*** | (2020.01) |
| *H04L 12/28* | (2006.01) |

(52) U.S. Cl.
CPC ............ *G01R 31/52* (2020.01); *G01R 31/58* (2020.01); *H04L 12/2801* (2013.01)

(58) Field of Classification Search
CPC ........ G01R 31/08; G01R 31/58; G01R 31/52; H04B 3/46; H04L 5/0048; H04L 7/0008; H04L 5/0007; H04L 5/001; H04L 12/2801
See application file for complete search history.

(56) References Cited

U.S. PATENT DOCUMENTS

2011/0274204 A1 11/2011 Ko et al.
2013/0077466 A1 3/2013 Takaoka et al.
2013/0291044 A1* 10/2013 Zinevich .......... H04N 21/44209 725/111
2015/0318937 A1 11/2015 Ruth et al.
2016/0173195 A1* 6/2016 Nielsen .............. H04N 21/6168 398/16
2018/0294837 A1 10/2018 Chapman et al.
2021/0135755 A1* 5/2021 Zinevich .............. H04B 10/612

OTHER PUBLICATIONS

Chrostowski et al. Leakage in a High Split World: Detecting and Measuring Upstream Leakage Levels in a One Gpbs Symmetrical High Split Hybrid Fiber Coax Network. SCTE-ISBE CABLE-TEC EXPO 2020. Oct. 12-15, 2020. SCTE-ISBE and NCTA.

* cited by examiner

*Primary Examiner* — Kenneth T Lam
(74) *Attorney, Agent, or Firm* — WCF IP

(57) ABSTRACT

A method of using customer premises cable modem equipment to generate a signal that can be used for leakage detection. Various signal types are described which are usable for the purposes of leakage detection.

30 Claims, 5 Drawing Sheets

| Truck Speed | Ft/Sec | Dist to Home | Detection Time |
|---|---|---|---|
| 50 mph | 73.3 ft/sec | 100 ft | 3.06 sec |
| 40 mph | 58.7 ft/sec | 100 ft | 3.82 sec |
| 35 mph | 51.3 ft/sec | 100 ft | 4.37 sec |
| 30 mph | 44.0 ft/sec | 100 ft | 5.1 sec |

LEAKAGE DETECTION FOR CABLE TV SYSTEMS WITH UPSTREAM SIGNALS ABOVE 118 MHz

CROSS-REFERENCE TO RELATED APPLICATIONS

This application is a continuation of U.S. application Ser. No. 17/938,389, filed Oct. 6, 2022, which is a continuation-in-part application of U.S. application Ser. No. 17/151,643, filed Jan. 18, 2021, now U.S. Pat. No. 11,496,182 issued Nov. 8, 2022. This application claims the benefit of U.S. Provisional Application Nos. 62/963,585, filed Jan. 21, 2020; 62/971,407, filed Feb. 7, 2020; and 62/975,495, filed Feb. 12, 2020. These applications are incorporated herein by reference.

FIELD OF THE INVENTION

The invention generally relates to cable networks and, more specifically, identifying network signal leaks so they can be repaired.

BACKGROUND

The Federal Communications Commission (FCC) requires all cable operators to monitor for any over-the-air signaling that has escaped from their cable system, commonly called "leakage", which will potentially harm the civil aircraft communications or FAA band (118-137 MHz). Any digital Quadrature Amplitude Modulation (QAM) leakage found above 17.4 μV/m measured at a distance of 3 meters must be fixed to prevent possible over-the-air interference.

One of the currently deployed methods used to detect QAM signal leakage utilizes a special type of signal that is inserted at the cable headend into the downstream cable TV channel lineup. It is then detected using specialized field equipment that looks for the inserted signal which has escaped through portions of the cable infrastructure that has shielding issues. The downstream cable TV channels are typically broadcast between 54 MHz and 1.2 GHz. Leakage detection is typically monitored either in or close to the 118-137 MHz frequency band to ensure compliance with the FCC ruling of protecting the FAA band. A typical frequency used to monitor leakage for FCC compliance is 138 MHz.

As the need for more upstream bandwidth by consumers continues to increase, additional bandwidth for the upstream portion of the cable spectrum is being converted from downstream use to upstream use. The typical upstream bandwidth is currently limited to 42 MHz for a low-split or 85 MHz for a mid-split architecture in the United States. The expanded upstream bandwidth will be increased to 204 MHz which is a significant bump up from 42 MHz. The change to use 204 MHz as the top end for the upstream spectrum is referred in the cable industry as a "high-split." The "split" is the frequency point at which the downstream and upstream are separated. The cable industry is currently taking a more aggressive approach to further move the split to an ultra-high split and/or a Full Duplex (FDX) architecture in which the upstream split can move to 300 MHz, 396 MHz, 492 MHz, 588 MHz, and ultimately 684 MHz.

When cable TV operators change their network to a high-split architecture, the upstream portion of the spectrum will expand to incorporate the civil aircraft communications or FAA band (118-137 MHz). This change will have a direct impact on the cable operator's ability to monitor and measure leakage in the FAA band. The special downstream signal used for leakage detection at 138 MHz can no longer be generated at the headend and inserted into the downstream portion of the spectrum. The 138 MHz frequency will now reside in the upstream portion of the spectrum. If the split eventually moves even higher up to 684 MHz, other portions of the cable spectrum that currently reside in a downstream only configuration will need to support upstream traffic.

This change in the spectrum allocation creates a need for a leakage detection solution that still utilizes frequencies in or near the FAA band as well as support other frequencies that are typically monitored for leakage such as 260 MHz, 400 MHz, and 612 MHz.

SUMMARY

This disclosure details methods for generating leakage detection signaling by using customer premise cable modem equipment to generate a signal that can be used for leakage detection in a manner that is compatible with the upstream traffic/signaling. Exemplary embodiments overcome the inability for a downstream leakage signal to traverse the network. Cable modems are widely deployed in customer homes and configurable to generate the leakage detection signal. The most practical implementation from a cost perspective is to control the cable modems and have them generate the leakage detection signaling that is compatible with leakage detection equipment. This solution avoids the necessity of requiring new signal-generation hardware to be added to the network. An alternative but more expensive configuration is to add new signal generator hardware in the network. Leakage detection solutions need to support upstream signal detection at any frequency below 684 MHz based on today's technology evolution; however this does not preclude the inclusion of using upstream signal detection across the entire frequency spectrum used by cable operators at they continue to move towards 1.8 MHZ and 3 GHz networks in the future.

According to some exemplary embodiments, a method of leakage detection uses an upstream signal that is time-sequenced across a defined number of cable modems. The upstream signaling that is transmitted by the cable modems are defined by the DOCSIS 3.1 and 4.0 Physical Layer specifications (CM-SP-PHYv3.1-107-150910). Standards not yet in implementation but adopted after the filing date of this disclosure may also be used. The modulation scheme used for upstream transmission is known as Orthogonal Frequency-Division Multiple Access (OFDMA). The specification defines a special mode called OFDM Upstream Data Profile (OUDP) that instructs the cable modem to generate a burst signal. The time sequencing of the OUDP signals for the cable modems in a service group is controlled by a headend device called the Cable Modem Termination System (CMTS) or by a remote PHY type device in a distributed architecture. In some exemplary embodiments, this specialized OUPD burst is used for the cable leakage detection signaling.

Utilizing OUDP burst signals as a method of leak detection offers an additional benefit from the perspective of precise leakage location identification. Utilizing time stamps that are synchronized from a controlling device and a receiver device allows a leak to be identified to a particular cable modem(s) associated with a corresponding home address(es).

According to some exemplary embodiments, a cable network leakage detection system comprises one or more controlling devices and one or more receivers. A controlling device may be configured to cause a plurality of household cable modems to transmit signals configured for a special use purpose directly into a cable upstream spectrum for purposes of finding one or more leakage sources in the cable network when the signals are detected in over-the-air spectrum. A controlling device may furthermore control time sequencing of the signals. An exemplary receiver may be configured to find, with or without using detection time stamps, the one or more leakage sources in the cable network when the signals are detected in over-the-air spectrum by the receiver. An exemplary receiver may be, for example, fly-over equipment, a vehicular receiver, or a handheld receiver.

An exemplary cable network leakage detection system may but need not necessarily take the place of downstream leakage detection solutions. For example, exemplary systems may be configured for compatibly with, and even take advantage of, one or both of a high split network architecture and a full duplex (FDX) network architecture. The signal generation of an exemplary controlling device allows cable operators to continue to use their current leakage detection equipment with modifications based on this disclosure to comply with FCC requirements, e.g., requirements of a high split change that exceeds the FAA band of 118-137 MHz. The measurement portion of this device will provide cable operators the ability to proactively monitor their networks on a more granular scale.

Exemplary devices according to this disclosure may have one or more data communication methods (e.g., wired or wireless) and Bluetooth capabilities. A data communication capability of an exemplary device may allow data capture to be integrated with other external devices and the ability to control or be controlled by the other devices remotely. A WiFi and/or Bluetooth capability of an exemplary device may allow field technicians to control and get data on a real-time basis when in proximity of the device.

DETAILED DESCRIPTION

It is to be understood that this invention is not limited to particular embodiments described. Embodiments practicing the invention as such may, of course, vary. It is also to be understood that the terminology used herein is for the purpose of describing particular embodiments only, and is not intended to be limiting, since the scope of the present invention will be limited only by the appended claims.

Figure 1:
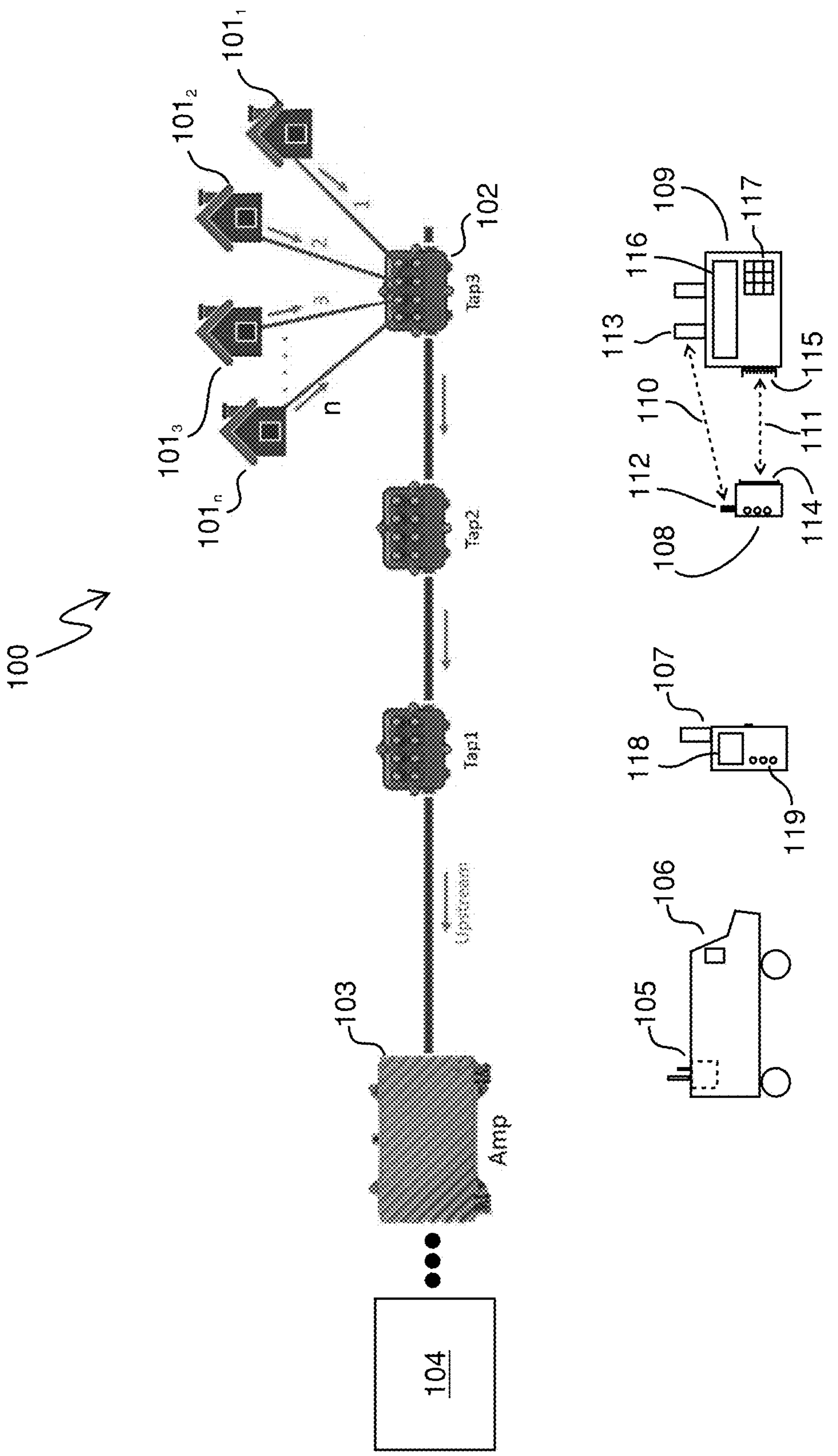
FIG. 1 is an exemplary cable network with integrated leakage detection system.

FIG. 1 is a schematic of an exemplary cable network leakage detection system 100. An overall function of the system 100 is to detect leakage from the cable network with which the system 100 is integrated. A method by which the system 100 operates comprises at least two steps which may occur generally simultaneously or in sequence. First, a plurality of household cable modems $\mathbf{101}_1$, $\mathbf{101}_2$, $\mathbf{101}_3$, . . . $\mathbf{101}_n$ (n being any integer) are configured to transmit signals configured for a special use purpose into a cable upstream spectrum. These signals may be referred to as "special-purpose" signals in this disclosure. As used in this disclosure, "special-purpose" signal is referencing the function of detecting leakage, however the signals are defined in the current or future DOCSIS specifications and are not generated in a non-standard format. The "special-purpose" term generally refers to the use of existing signals which are compliant with modem standards but used for one or more purposes for which the signals were not originally intended under the existing standards. The DOCSIS compliant signals have been repurposed for special use cases such as leakage detection.

The household cable modems 101 are DOCSIS compliant, e.g. DOCSIS 3.1 or later versions of DOCSIS. As the special-purpose signals are transmitted through the cable network, leakage locations are identified when the special-purpose signals are detected in over-the-air spectrum using compatible leakage detection equipment. Generally speaking, monitoring for leakage may be conducted along any portion of the entire path between the modems 101 and the headend device 104. Consistent with existing cable infrastructure, the path of the special-purpose signals may generally be from the modems 101 to a tap 102 and then to subsequent taps and an amp 103 or subsequent amps along the upstream signal pathway to the headend device 104. The over-the-air spectrum may be measured, either continuously or periodically, along this upstream signal path in search of the special-purpose signals. Over-the-air detection and measurement may be performed by only one or else a plurality of different device types with receiver capabilities. For instance, detection and measurement of leakage signals may be performed by a vehicular receiver device 105 incorporated into a vehicle 106 and/or a handheld device 107. The handheld device 107 may be a standalone or integrated handheld device. An exemplary handheld device 107 may include interfaces 118 and 119. As another alternative, an exemplary handheld device may comprise at least two devices 108 and 109 which are separate or separable. The at least two devices 108 and 109 include a first device 108 which is a leakage detector and a second device 109 configured to perform one or more other measurement functions besides leakage detection. A data communication and/or control link 110 and/or 111 exists between the at least two devices 108 and 109. The link 110 is wireless, conducted between transceivers 112 of device 108 and 113 of device 109. Used in addition or in the alternative, the link 111 is wired, established by the physical connection of connection terminal 114 of device 108 and connection terminal 115 of device 109. The data communication and control link 110 and/or 111 may permit one or the other of devices 108 and 109 to control aspects of the other device, e.g., the operation of the transceivers 112 or 113, or input/output utilities of e.g. a display 116 or buttons or keyboard 117.

In order to avoid the addition of another external device into the cable network infrastructure, the signal generator function can be integrated into the cable taps, either existing or new. This can be done by incorporating the circuitry either directly into the tap face plate or into the body of the tap. The level of the signal will be adjustable to cover the range of tap values that typically span from 8 dB, 12 dB, 17 dB, 20 dB, 23 dB, 26 dB, and 29 dB. Other tap values are possible as this is an example list of typical values. The signal level would be adjusted to a predetermined level relative to the upstream channel levels. However the signal power level is not limited to the upstream channel levels and can be increased to much higher levels up to, but not limited to, 70 dBmV. The signal is not limited to any specific signal type. The signal generator can produce a range of signal types depending on the application and can include but not limited to CW carriers, DSBSC signals, multiple CW tones, and both modulated and unmodulated signals. In all cases the signal can be adjusted in both frequency and amplitude. The generated signal will be injected and/or coupled into each of the tap ports as well as the input and/or output port of the tap. The generated signal can be used for leakage detection purposes that is compatible with existing handheld and fly-over equipment. The generated signals can be detected using any type of receiver device that is tuned to receive the generated signal. The generated signal is not limited to be used for leakage detection. The signal can be used for any type of application that would make use of said signal.

Exemplary handheld devices cover a broad spectrum of uses and device types as it relates to leakage detection. Exemplary handheld devices according to embodiments of this disclosure generally share at least one function: the ability to detect RF leakage, e.g., at least upstream leakage or both downstream and upstream RF leakage that escapes from in the cable TV infrastructure, including the network, the customer drop, and the customer premises. An exemplary handheld receiver/detection device may be configured to detect leakage from any portion of the infrastructure that carries RF signaling from/to the cable headend to/from the customer premises.

Handheld devices that are capable of downstream and upstream leakage detection come in any of a multitude of types and forms, depending on the embodiment. As a first non-limiting example, an exemplary handheld device may be standalone leakage detection equipment configured solely to detect, measure, and locate leakage sources. As a second non-limiting example, some handheld devices are configured to connect externally to other types of equipment to add leakage detection capability to the equipment with which a connection is made. These types of leakage detection devices may either be physically attached to another device or may be wirelessly connected to such other device (e.g., via Wifi, Bluetooth, Cellular signal). In both cases, the intent of the leakage detection device is to measure and collect leakage information that can be shared with the second device to which connection is made if desired. An exemplary add-on leakage detection device may also share other functionality with the second device to which connection is made, such as but not limited to power, timing, processing, location information (e.g., GPS coordinates), and other types of information exchange. A leakage detection device of some embodiments may be configured to be permanently attached to another device, to be semi-permanently attached to another device, or to be removable whenever the operator desires. Some exemplary devices may be integrated devices, which stand in contrast to standalone leakage detection equipment. Integrated devices are another category of handhelds which may contain downstream and upstream leakage detection functionality. Integrated devices contain a leakage detection capability that is physically integrated into a single instrument that performs other one or more other functionalities besides leakage detection. A non-limiting example of an integrated device is an RF meter that also has the ability to perform leakage detection for one or both the upstream and downstream directions of signals in the network.

Some exemplary handheld leakage detection devices may be required to be backwards compatible with currently technology, e.g., devices and methods that use downstream signaling. Cable operators are expected to convert their network architecture over time to architecture types that will require upstream leakage detection, such as high split or full duplex (FDX). In a FDX network, portions of the upstream spectrum may overlap with portions of the downstream spectrum. In other words, upstream signals and downstream signals may simultaneously occupy some of the same frequencies as one another. For network architectures such as FDX, exemplary devices including exemplary handheld devices may be configured to have the capability to detect both downstream and upstream leakage, in some cases simultaneously. Depending on the network evolution speed and type of architecture, an exemplary handheld device and related methods of leakage detection may be required to perform simultaneous measurements of downstream and upstream leakage detection.

In some exemplary embodiments the special-purpose signals are pilot tones and/or subcarriers and/or the spectral content of subcarriers. The pilot tones and/or subcarriers and/or spectral content may be contained within OFDMA (Orthogonal Frequency Division Multiple Access) signaling. The OFDMA signals may be OUDP burst signals. The special-purpose signals may be encoded using either a time or frequency multiplexing method.

Figure 2:
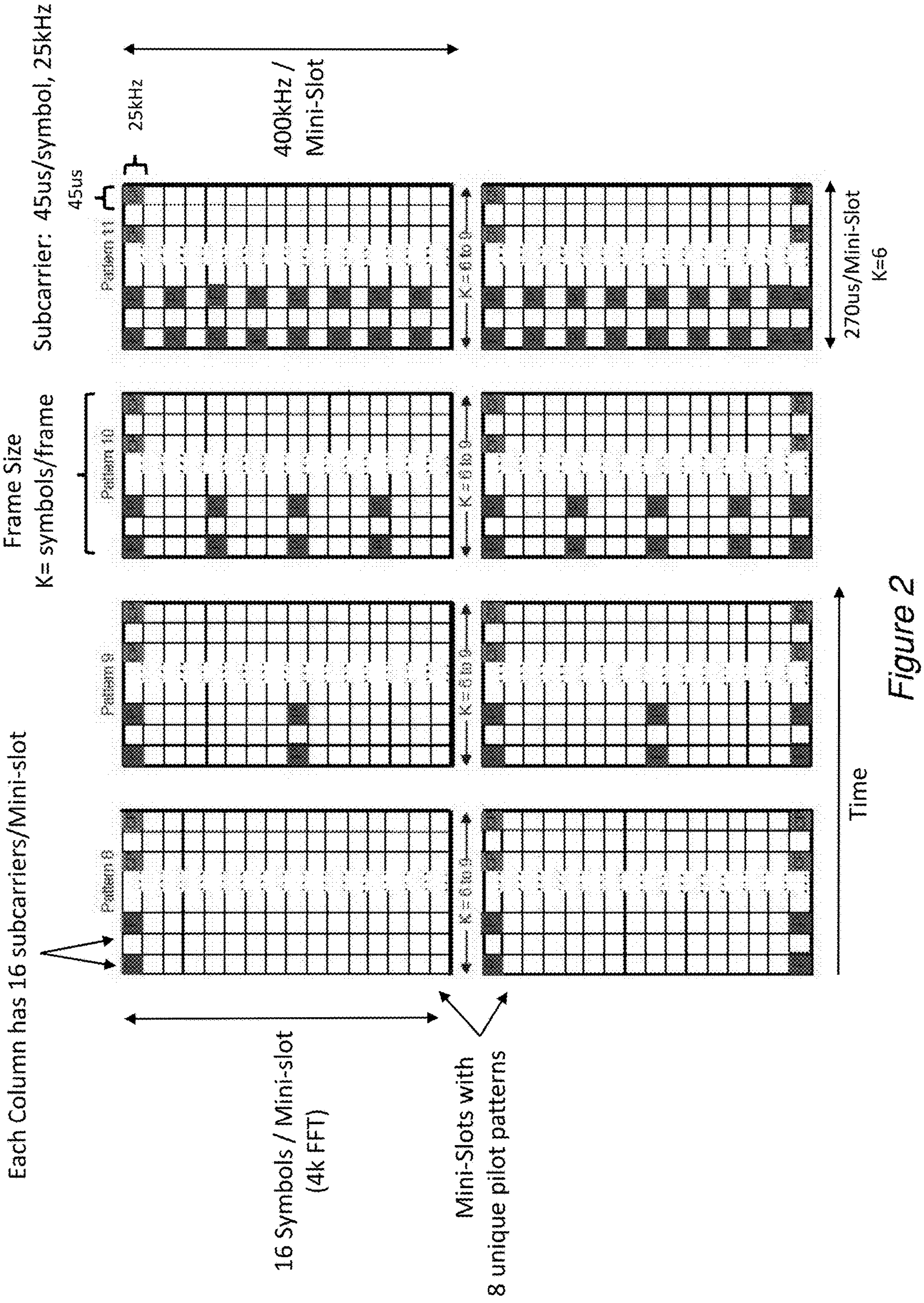
FIG. 2 is a visual representation of OFDMA OUDP burst signal showing the relationship between subcarriers, frame size, and pilot patterns.

FIG. 2 is a visual representation of OFDMA burst signal for embodiments in which the special-purpose signal for leakage detection is an OUDP burst signal. In FIG. 2 each of the eight boxes represents a mini-slot with different pilot patterns, in particular Pilot Patterns 8 to 11 of the DOCSIS 3.1 physical layer specification. Each mini-slot comprises a plurality of subcarriers which is dependent on the FFT size. A 4K FFT has 16 subcarriers. A 2K FFT has 8 subcarriers. Each small block in a mini-slot represents a subcarrier at a specific symbol time. Each of the mini-slot columns represents a time slot or frame of 16 subcarriers (4*k* FFT). For example, if K=6 where K=the number of frames or time slots in each mini-slot then each mini-slot duration is approx. 6 frames×45 μs/symbol=270 μs. Each minislot occupies 400 kHz of spectrum (16 subcarriers×25 kHz/subcarrier=400 kHz of spectrum). The red boxes labeled "P" represent the timing and symbol location of the Pilot tones. The green boxes labeled "CP" represent Complimentary Pilots. The parameters of OUDP burst signal are defined in the DOCSIS 3.1 physical layer specification to serve standard network functionality, however they can be repurposed to be used for leakage detection as well. The parameters/burst variables that may be specifically configured may include but are not limited to center frequency, minislot bandwidth, minislot time duration, pilot pattern, transmit power, number of minislots, number of frames, modulation order, FFT size, cyclic prefix, and the window roll off period. Several of these will now be discussed in turn.

Center frequency needs to be aligned to be compatible with the useable frequency range of the leakage detection equipment. There are various types of leakage detection technology that can be employed to pick up the OUDP or other special signal types. One example is to use analog to digital (A/D) sampling of the signal and use an FFT to decode the pilot tone locations. Another method uses A/D sampling in combination with a matched filter to use cross-correlation as a matching method. Both of these methods are currently in use today. Whichever method and/or leakage detection technology is used, it is optimized to capture the type of special-purpose signal that is generated and to provide a minimum performance level that is able to detect an equivalent of a 17.4 uV/m leak across 6 MHz at a 150 foot distance. It is important to note that the 17.4 uV/m power measurement is the equivalent to a 6 MHz QAM power measured at distance of 3 meters from the leak.

Each minislot occupies a specified bandwidth of, e.g., 400 kHz. A 4k FFT has a 25 kHz subcarrier and will contain 16 subcarriers per minislot. A 2k FFT has a 50 kHz subcarrier bandwidth and will contain 8 subcarriers per minislot. The number of minislots used in the OUDP burst needs to be compatible with the leakage detection equipment and configured to achieve the desired performance. Using too many minislots for the burst can have a negative impact on the cable performance as it uses up limited available bandwidth.

The minislot time duration or frame size is specified by the number of symbols/frame by the symbol "K" which is typically in the range of 6 to 16. Each subcarrier also contains a configurable cyclic prefix which can range from 0.9375 μs to 6.25 μs. Thus a time duration for a single symbol with a 4k FFT and a 5 μs cyclic prefix is 40 μs+5 μs=45 μs.

Pilot pattern determines the density of the pilot tones that are contained within each minislot. Pilot tones can be used as part of the leakage detection methodology. Typically a higher density of tones provides better detection sensitivity.

The transmit power level of the OUDP signal has a direct impact on the performance of the leakage detection equipment. The higher the signal level, the more sensitivity the leakage detection equipment may potentially have as a higher ratio of the OUDP signal relative to the OFDMA spectrum provides more usable signal to work with. The OUDP transmit power is typically set to match the surrounding OFDMA levels. However, the use of OUDP burst signals with a transmit power set higher than the OFDMA levels is an alternative.

The amount of spectrum used by the burst is determined by the number of minislots. For example, a burst with two minislots with 16 subcarriers each with a 4k FFT occupies 25 kHz×16 subcarriers×2 minislots=800 kHz.

The number of frames determines the time duration of the burst. For ten Frames with a 4k FFT and K=6, the duration of the burst would be 10×(40 μs/symbol+5 μs/cyclic prefix)×6 symbols=2.7 ms.

Figure 3:
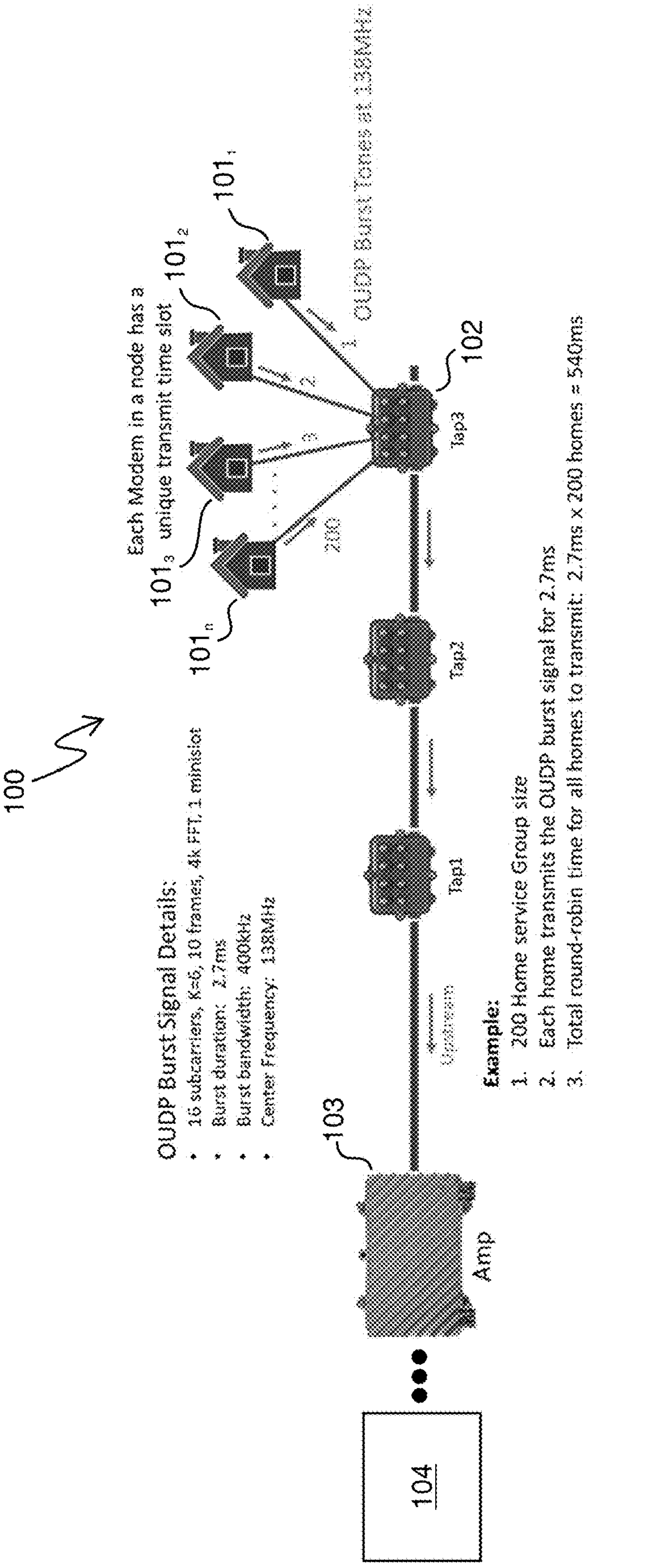
FIG. 3 is an example of OUDP burst signal being transmitted in a 200 home service group.

FIG. 3 shows an example use case for system 100 labeled with details showing the amount of bandwidth (400 kHz) and round-robin burst time (540 ms) it would take to cover a 200 home service group.

Though the household modems generate the special-purpose signals for leakage detection, the coordination and control of the modems may be conducted by a controlling device such as but not limited to a headend device or a remote PHY node. The configuration of the special-purpose signals generated by the cable modems in a service group may be controlled by a headend device called the Cable Modem Termination System (CMTS) or a remote PHY device in a distributed architecture. For exemplary purposes, the CMTS will be referred to in the following exemplary setup, but other controlling devices may be used as an alternative. The CMTS will be set up to have a defined set of cable modems (service group) to transmit the special-purpose signal (e.g., OUDP burst signal) in a round-robin and time-sequenced manner. The CMTS also controls the output signal level and duration of each burst. For example, if 100 modems were defined as a service group, each modem would take turns transmitting the OUDP signal for a specified duration, frequency, and level until all 100 modems have transmitted. Once all of the modems have transmitted, the transmit cycle would start over again and continue operating in this mode.

In order to calculate the optimal settings for the OUDP burst signal, the following operational boundaries should be identified: (i) Minimum Service Group size (number of homes in the round-robin), (ii) Maximum channel capacity loss due to burst signals, (iii) Minimum Leakage detection distance to pick up 17.4μ/m leaks, (iv) Minimum burst duration and burst bandwidth needed for leakage detection, and (v) Maximum speed of vehicle to pick up leaks. Once these boundaries have been established, it is possible to calculate the optimal settings for the OUDP burst signal. It may be that all of the operational boundaries cannot be achieved without compromise. This is largely dependent on the performance requirements of the leakage detection equipment and the minimum acceptable impact on network performance.

Exemplary embodiments may improve precision of leakage location identification using a time tracking/time stamping method. As discussed above, a plurality of household modems are caused to transmit a special-purpose signal according to a predetermined schedule. The transmission times from respective ones of the plurality of household cable modems may be recorded, as may the detection times of respective leaks. The transmission time stamps and the detection time stamps are synchronized to a common reference clock source. By comparing and matching transmission and detection times, the leakage locations can be localized with considerable precision, such as to a specific group of houses or even to a specific house. A more detailed exemplary embodiment will now be described, using OUDP burst signal as the exemplary special-purpose signal for leakage detection. Other signal types besides OUDP burst may alternatively be used with the time stamping/tracking techniques described.

A controlling device (i.e., controller) such as a CMTS or Remote Phy instructs when each end user's cable modem should transmit a special signal used for leakage detection. The controlling device may be used to determine when each of the cable modems transmits the special signal throughout the day. The time of transmission is preferably accurate down to a specific millisecond during each day and synced to a common clock source such as GPS. The transmission times are recorded in a storage medium such as in one or more computers (e.g. servers). The controller or other device is configured with an ability to recall when each of transmission occurred or follows an exact transmission schedule which is predetermined and stored. In either case, the time when each modem is instructed to transmit the special signal is known and recorded, e.g. down to a single millisecond (ms) for all hours in a day, every day.

The receiving device, e.g. arranged in a moving vehicle, configured to detect cable leakage that is from the transmitted special-purpose signals is further configured to record a time (e.g., time stamp) when each leak is found. As with the time recording for the transmission, the better the precision of the time stamp of leakage detection the more precision in leakage location identification. Precision of at least as small as a millisecond (ms) is desirable. The receiver device is synchronized to the same reference clock source as the controlling device.

Information about each detected leak including the recorded detection times may be stored on storage medium such as a cloud server accessible from anywhere convenient with a cloud server application. The stored information may include a time stamp of when the peak of a leak was detected.

The leakage time stamp is then compared to the time stamp information from the controller. The matching time stamp on the controller (or nearest match) is then be used to determine which household modem was instructed to transmit at the time the peak of the leak was detected. A near match of time stamps, e.g., the recorded time of transmission and the recorded time of detection (peak), are possible if not to be expected. In this case the nearest matches may be used to narrow the leakage location identification to a group of houses or even to a single house. The GPS location of the leak can also be used to narrow the list of possible homes that caused the leak, providing a second layer of information which can be used to increase the accuracy of the location feature.

The identified house address is then associable with the detected leak. The result is a method of localizing the location of a leak down to a particular house or a group of houses.

Figure 4:
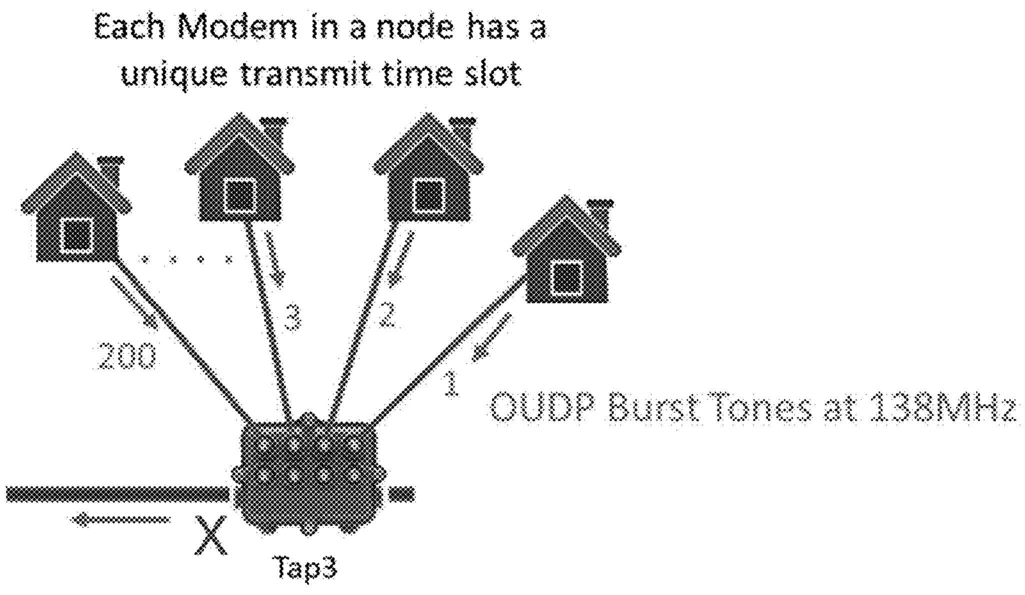
FIG. 4 illustrates a specific non-limiting example of using time stamping to improve leakage location identification precision.

FIG. 4 illustrates a specific non-limiting example of using time stamping to improve leakage location identification precision. In FIG. 4, each home is scheduled to transmit every 2.7 ms. In this simplified example, each home has a unique time stamp for each time it is instructed to transmit. If a vehicle with a leakage detector drove by these houses and the leak was recorded at 8.1 ms, the leak would be associated with house 3. The address and/or GPS location of the house would then be linked to that particular leak. This may be very useful information when a technician is assigned to go find and fix this particular leak.

The preceding paragraph describes a scenario in which a leak occurs on the so-called drop side of the cable network. Referring again to FIG. 4, it is also possible to have leakage in the portion of the cable network that is commonly referred to as the network side. The network side includes the taps and all of the interconnecting hardline cable. A network leak is indicated in FIG. 4 by the larger red X at Tap 3. If the leak were to occur at this juncture, the resulting leakage signal would contain burst signals from each of the homes connected to the tap. The burst signals could also be identified by their time stamps. Thus the detected leakage signal would contain four burst signals with their respective time stamps of 2.7 ms, 5.4 ms, 8.1 ms, and 10.8 ms. This collective set of burst signals can now be used to identify that the leak is at or after the tap location. This additional information is used to more accurately identify the location of the leak and identify if the leak is on the drop side or network side of the tap. If the leak was located further up the network after a series of taps, the resulting leakage signal would contain all of the burst signals from each of the homes that are connected to the downstream taps. Again this type of information is usable to locate leakage with a greater degree of accuracy.

Much of the preceding discussion uses as an exemplary special-purpose signal burst signals, especially OUPD burst signals comprising OFDMA minislot components. Alternate signal types may be used in embodiments in addition to or instead of burst signals. Generally speaking, a variety of suitable signals can be generated from the customer premise cable modems and used for leakage detection purposes. Some embodiments may employ special-purpose signals which are continuous or non-continuous, modulated or non-modulated. The transmitted signal may include other signaling types such as a CW burst tone, which can either be modulated or unmodulated.

The special-purpose signal for leakage detection may be a continuous signal type, such as a continuous wave (CW) or multiple CWs. Continuous signal types, that is signals transmitted constantly (always on), solve timing related issues associated with a time sequenced approach. Vehicles equipped with leakage detection equipment are able to detect the presence of the leakage from these types of signals without the need for timing accuracy. However, using continuously-on signal types for leakage detection in the upstream creates additional challenges for the cable operators. The continuous signals and potential exclusion zones require the use of a portion of the OFDMA spectrum that would otherwise be used for data capacity. Another issue is that all of the cable modems in a given system may transmit at the same time at approximately the same frequencies. This means the power from the continuously-on signals would be additive and could potentially overload the upstream return laser. Embodiments using continuous signal types for the special-purpose signal may handle these issues by adjusting the power level of the signals to make sure they do not disrupt the upstream network capabilities.

Time-sequenced special-purpose signals may be either modulated or unmodulated types. For example, in some embodiments an unmodulated CW or CWs are used for leakage detection in similar fashion as the OUPD burst signals discussed above. The customer premise modems are configured with the capability to produce such signals and controlled by a controlling device to generate the CW's in a predetermined pattern and duration. For example, the time sequencing is controlled by a headend device, such as a CMTS, or a networked device such as a Remote Phy node. The signal burst duration, pattern, levels, and bandwidth are subject to similar rules as the OUDP burst signal. The signal parameters are set to be compatible with leakage detection receivers in various applications and to have acceptably low amounts of impact on the cable network capacity.

Figure 5:
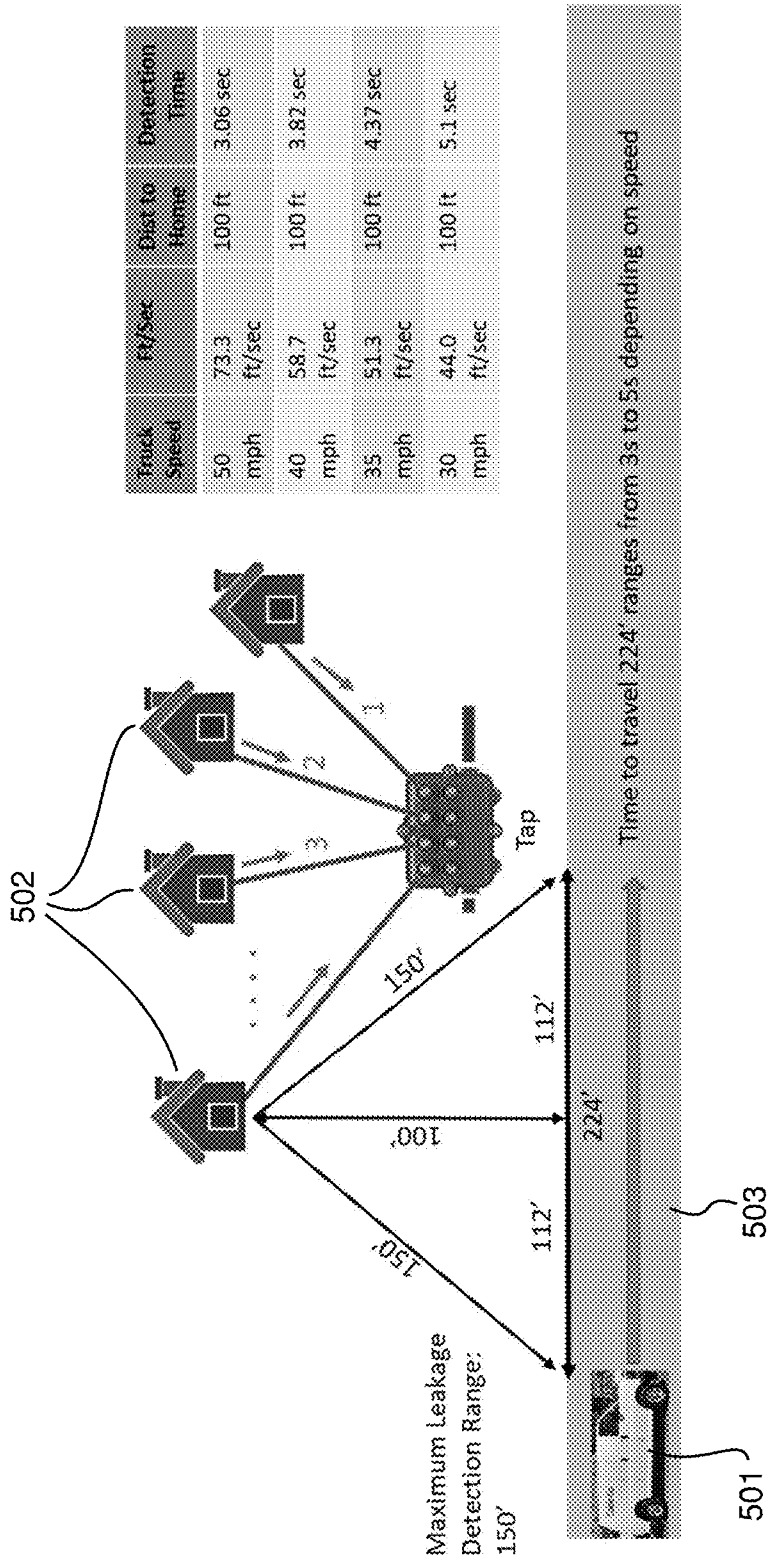
FIG. 5 is a diagram respecting the actual detection of leaked special-purpose signal.

FIG. 5 is a diagram respecting the actual detection of leaked special-purpose signal. Considerations about how detection is performed bear on how the special-purpose signal is configured and generated, since the generation and detection steps must ultimately be coordinated to accurately identify leakage locations in the cable network.

One of the main leakage detection applications required by cable operators is to measure leakage while in a moving vehicle. The OUPD burst signal characteristics are specifically configured for moving vehicles. A non-limiting list of variables affecting detection from a moving vehicle include the following: distance from leakage source location to leakage detection equipment, speed of vehicle, average distance of homes to street, bandwidth of burst signal, and time duration of burst signal. The maximum distance between the leakage location and leakage detection equipment is based on the need to detect 17.4 μV/m leakage measured at 3 meters, a threshold set by the FCC.

FIG. 5, for the purposes of illustration, gives an example of measuring leakage signal with a moving vehicle 501 using reasonable exemplary parameters. In this example, the numbers used for the variables are as follows: maximum vehicle speed for leakage detection of 50 mph, average distance from homes 502 to street 503 of 100 feet, maximum distance to measure a 17.4 μV/m leak of 150 feet.

Using the numbers of the preceding paragraph and a worst case scenario of 50 mph, the truck 501 will be in measurement range of the leak for 224 feet which equates to a 3 second window. During this 3 second window, the home with the leak must transmit at least one OUDP burst so that it can be picked up by the leakage detector in the truck 501.

Reusing the numbers shown in the example in FIG. 3, the round-robin time was 540 ms for 200 homes. In this scenario, the burst signal would be transmitted 5.6 times within the three second drive window.

Using this example's three second detection window, the optimal OUPD burst signal can now be determined. The burst signal parameters will be determined by evaluating the requirements of the leakage detector verses the cable network. Some of the tradeoffs that must be analyzed are burst duration, burst bandwidth, and network performance.

Burst Duration has both a leakage detection impact and a network impact. Depending on the method of leakage detection, increasing the burst duration may increase the detection sensitivity of the leakage detection equipment as a longer duration of the burst signal provides the opportunity for a greater digital signal processing sample size. In general, doubling the burst duration will increase the detection sensitivity by 3 dB. Respecting network impact, the longer the burst duration for each modem, the longer it will take for all of the modems in the service group to complete the round-robin. Thus for longer burst times, the number of homes in the service group must be reduced so that the round-robin time stays under three seconds or provides the required number of bursts for leakage detection. Another alternative to maximizing the burst size and the number of homes in a service group is to coordinate the generation of simultaneous bursts from modems/homes that are in different parts of the service groups. For example if 2 or 3 bursts are simultaneously generated from modems in different parts of the service group, the round-robin time to cover all the homes is reduced by 2 to 3 times respectively. There are trade-offs to this approach. This method would have additional complications associated with it as it requires additional control algorithms to ensure the simultaneous bursts cover all the homes in a service group in such a manner that they remain geographically dispersed. This would also add complication to using the time stamps for leakage location as each of the simultaneous bursts would have the same time stamp.

Burst bandwidth has both a leakage detection impact and a network impact. Depending on the method of leakage detection, increasing the bandwidth of the burst signal may also increase the detection sensitivity. Respecting network impact, the more bandwidth the burst uses, the more it will reduce the amount of OFDMA used to transmit data. For example, if 400 kHz of bandwidth is used for the burst signal within a 96 MHz OFDMA block, the channel capacity would be reduced by 0.42% (400 KHz/96 MHz). From the cable operator's perspective, the OUDP burst signal should have a minimal impact on the data channel capacity and should maximize the service group size. These must be taken into account to ensure both network and leakage detection performance are balanced.

Customer premise cable modems continue to evolve in both capability and performance. As new technologies emerge and continue to evolve, the ability of the cable modems to generate and transmit different signal types will also change. Such transmitted signals of any type from customer premise cable modem devices for the purposes of leakage detection are envisioned by this disclosure and may be used consistent with the methodology disclosed herein.

The most practical implementation from a cost perspective is to control the cable modems and have them generate the leakage detection signaling that is compatible with leakage detection equipment. This solution avoids the necessity of requiring new signal-generation hardware to be added to the network. An alternative but more expensive configuration is to add new signal generator hardware in the network. An external signal generator could be placed at the last amplifier in a distribution chain. The signal generator transmits a continuous DSBSC at 30 dB down between two QAMs or at a suitable level that does not cause interference with the existing upstream signaling. It is also possible to use two pilot tones if the spectrum is occupied by OFDMA type signaling. It is also possible to use any type of generated signal that can be reliably detected by a corresponding receiver. This generated signal would effectively cover the entire cable network and would require fewer devices to be deployed verses putting devices into every customer home or at the tap. If a Remote PHY network with a Node+zero amplifier configuration is used (no amplifiers), the device would have to be located directly after the R-PHY output. There is also a possibility for the R-PHY to generate the signaling into the upstream using its own internal capability, assuming the R-PHY node can be configured to do so. This would eliminate the need for an external signal generator, however it may not be possible for the R-PHY to transmit signals in the downstream direction utilizing the upstream spectrum. The use of the external generator located at the last amplifier or after the R-PHY in an N+0 network allows the use of current handheld leakage detection equipment and vehicle detection devices; it requires fewer devices to be deployed, and the power constraints on the generated pilot tones are lessened.

Returning to FIG. 1, leakage detection may be performed by a vehicular receiver device 105 incorporated into a vehicle 106 and/or a handheld device 107 and/or a combination of devices such as 108 and 109. As further context, there exist generally two distinct applications in leakage detection applications. First is vehicle applications which rely on a vehicular detector 105. These are used for general location and severity purposes. Second is handheld applications which rely on one or more handheld devices such as devices 107, 108, and 109. Handheld devices are generally used by a technician outside of a vehicle and independent of the vehicular detector 105 to pinpoint the source of a leak so it can be fixed.

There are significant differences in the design requirements and features between a vehicle-based leakage detector and hand-held leakage detectors. Outside of both devices detecting leakage, they have little else in common. An exemplary handheld leakage detector has additional complexity over the vehicle detector that is not obvious in a vehicle-based design. The vehicle detector 105 may be designed to be permanently integrated into a vehicle 106 and never touched by a technician. By contrast the handheld devices 107 or 108/109 may provide a vast range of tools and features for the technician to use, an industrial design. and ruggedization for harsh environmental conditions, directional and near-field antenna use, stringent power management and battery selection, accurate signal strength measurements with continuous positional change with far and near field leakage patterns, and a variety of real-time feedback information to provide the user directional information. Handheld leakage detection in a high split network environment is even more difficult as there is likely to be a plethora of high level leakage signals coming from homes.

Exemplary handheld devices may provide a range of tools that allow a technician to adapt to a variety of environment situations. Examples of such tools include but are not limited to the following. The handheld device may be configured to work in concert with other leakage tools such as "pressure testers" which use different signal types. Thus the handheld device may have the ability to detect leakage signals as well as signals from other forms of test equipment and protocols. The handheld device may have the ability to lock on to one leak if there are multiple leaks in one area that are similar in level. The technician will have a difficult time to track down a particular leak if there is continual interference from nearby leaks. The handheld device may provide gain attenuation to allow the technician to find very large leaks at close proximities. Without this feature, the signal level may overload the device's signal measurement range. Handheld devices may be able to communicate with other types of devices such as mobile phones to allow a broader range of features, display options, remote control, etc. Handheld devices may have direct controls for user preferences such as volume control, peak-hold settings, distance settings, unit preferences, etc.

As an exemplary vehicle 106 equipped with vehicle-configured leakage detection equipment 105 travels around the cable operator's network, a primary objective is to provide a general location and signal level of each leak found. Vehicles use non-directional antennas that pickup leakage signals in a 360-degree radius, geo-locating a leak to a 500 foot radius, for example. This may require the vehicle device 105 to use a peaking algorithm or GPS triangularization that locates a leak when the maximum amplitude is measured as the vehicle 106 approaches the leak and then moves away from the leak. "Leakage location" obtained with a vehicle may be defined as a large general area of a given radius in a cable RF network that surrounds a leakage source. On a typical residential street, this means a common "leakage location" is a general area encompassing several neighboring homes and the cable infrastructure shared among them. These locations identifying broad swaths of real estate do not in themselves permit finding leakage sources and fixing the leaks from those sources.

Handheld techniques and devices are distinct from, and typically follow after, vehicle techniques and devices. For an exemplary handheld device 107 or 108, the challenge is to detect and physically find leakage sources as the technician moves the handheld device 107 or 108 around with his or her hands while walking on foot. A "leakage source" may be defined as any point in the cable RF network in which there is a shielding integrity flaw that allows RF signaling to escape into the air. Examples of a leakage source include but are not limited to a specific modem, or a specific section of cable, or a specific tap. Vehicle techniques and equipment do not find leakage sources; rather, vehicle techniques only identify large general areas in which the leakage source is known to exist without precision. A technician on foot must precisely find the "leakage source" to make a repair. This is accomplished with a handheld receiver which has a directional-type antenna and which can provide both visual and audible real-time feedback (e.g., with an input-output, I/O, device such as but not limited to screen 118 of device 107 or screen 116 of device 109) to the technician to precisely find the leakage source. Vehicle applications must account for high speed travel. For instance, up to 55 mph is a typical accepted maximum driving speed of a vehicle 106 in the industry. By contrast, handheld applications and equipment must account for a technician's hand movements which, relative to the fast moving vehicle 106, may involve very small deviations from an almost stationary position. The level of a leakage signal may vary with the slightest change in position of the handheld device 106 or 107 thus making it difficult to provide an accurate indication of the signal level. An exemplary method for leakage measurement by a handheld device may use a form of averaging that takes into account the signal strength variations that are caused by the positional changes. An objective of an exemplary handheld device is to provide as much level accuracy as possible with small position changes, whereas an objective of an exemplary vehicle-based device is to provide location information based on general signal level information.

Vehicle devices like device 105 may use GPS tracking in combination with a detected maximum peak amplitude to generally locate a leak. Handheld applications and devices like devices 107 and 108 are used to track down a specific location of a specific leakage source. An exemplary handheld device 107 or 108 provides information to the technician to guide him or her to the leakage source. For many exemplary embodiments, no GPS information is required or used in this process. GPS may be used, but generally it is optional whereas in a vehicle application GPS may be required. Leakage source information may be provided to a technician from a handheld device by a continuous real-time display of the leakage amplitude on a display 118 or 116. As the technician moves towards the leakage source the amplitude of the leakage signal will increase. The technician will continue to walk towards the leak by using the signal strength indicator to maximize the level. Once the technician is in a very near proximity of the leakage source, the technician will likely be in the near field region of the leakage radiation. The handheld device 107 or 108 may then be reconfigured through an I/O interface such as buttons 119 or 117 for near field detection to allow the technician to further pin point the source of the leakage. Vehicle applications and vehicular devices like 105 do not generally have this capability as it is not within the scope of the intended or desired functionality.

Vehicle devices may use a vertically polarized antenna mounted on a metal ground plane. Handheld devices may have an antenna that is connected to the device without a ground plane. Exemplary handheld antennas provide directionality information which vehicle antennas do not. Leakage detection devices that are for vehicle applications use antennas that are mounted on a metal plane on the exterior of the vehicle. Typical mounting solutions use a magnetic base with a vertical whip antenna. These are placed on the vehicle to provide as much ground plane as possible given the limited areas that the antenna can be located. The antenna signal is then run into the vehicle's interior via a RF cable to the leakage detection device. Thus the device must have the appropriate RF connections to allow for an external antenna as well as connections for a GPS feed.

Conversely, an exemplary handheld leakage detector requires a different antenna type, preferably one that provides directionality such as a di-pole or Yagi antenna. These types of antennas have an antenna pattern that is narrowed with a higher gain lobe in the front of the pattern. This allows the technician to physically point the antenna in the direction of a leak to obtain the maximum leak level amplitude. The handheld design may incorporate the use of such antennas and leverage the directionality that they offer. The vehicle devices do not have this design requirement.

Exemplary vehicle applications and devices may monitor all frequencies or frequency bands of interest without technician control and report any leakage found within each band. The number of frequency bands monitored by a vehicle application typically ranges from two to four. Exemplary handheld devices may support the detection capability of all bands but also give the user the ability to select and focus on a single frequency band. Exemplary handheld devices may allow the user to select individual frequencies or small frequency bands of interest. This is desirable in large part due to leakage radiating most efficiently at its resonant frequency. Thus some leaks are better radiators at lower frequencies and some other leaks at higher frequencies. In order for a technician to locate and find a leakage source, an exemplary handheld device is able to select the frequency band that aligns to the frequency that has the maximum leakage power levels. The technician may also be enabled by the handheld device to tune or select the antenna that matches the selected frequency of interest.

Vehicle applications and devices may communicate recorded data back to a server that is not real time sensitive. Exemplary handheld devices, by contrast, communicate leakage information directly to the end user in an audible and visual format so they can act in real time. One of the primary objectives for a vehicle-based leakage detection device is to measure, collect, and send data to a centralized server. The typical transfer of data is done either via a cellular or WiFi connection. The data is collected in order for the cable operator to manage the leakage data and to issue work orders for technicians to fix the cable leakage over a period of days and weeks after the initial data is collected for detected signals.

An objective for an exemplary handheld device is to provide a technician with real time feedback. The measurement data of the handheld device may but is not necessarily used for database purposes but rather to help the technician locate the exact source of the leakage. The handheld device provides the technician with feedback tools that will guide him or her in the direction of the leak. These tools typically are in the form of a visual display of the leak amplitude and an audible alert that changes in volume that correlates with the signal level. The stronger the leakage signal level, the louder the alert may become. The audible signal can also change in frequency/pitch to indicate what frequency range of the leak. A higher audible tone frequency may indicate a higher frequency leak, for example. Visual or audio outputs are desirably minor or non-existent in vehicular applications, since they may distract the driver of the vehicle thus presenting a safety risk. Some vehicle devices may therefore be completely silent and/or completely out of sight.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

What is claimed is:

1. A method of cable network leakage detection, comprising finding, with a leakage detection device of a moving vehicle and without using detection time stamps, one or more leakage sources in the cable network when signals configured for a special use purpose which were transmitted from a plurality of household cable modems directly into a cable upstream spectrum and which were subject to time sequencing control by a controlling device are detected in over-the-air spectrum by the leakage detection device.

2. The method of claim 1, further comprising measuring over-the-air spectrum in search of the signals configured for the special use purpose.

3. The method of claim 1, wherein the signals configured for a special use purpose are pilot tones and/or subcarriers and/or the spectral content of subcarriers.

4. The method of claim 3, wherein the pilot tones and/or subcarriers and/or spectral content are contained within OFDMA (Orthogonal Frequency Division Multiple Access) signaling.

5. The method of claim 4, wherein the OFDMA signals are OUDP burst signals.

6. The method of claim 1, further comprising using either a time or frequency multiplexing method for the signals configured for a special use purpose.

7. The method of claim 1, wherein the controlling device is a headend device or a remote PHY device.

8. The method of claim 1, wherein the leakage detection device comprises at least two devices which are separate or separable, the at least two devices comprising a first device which is a leakage detector and a second device configured to perform one or more other measurement functions besides leakage detection, wherein a data communication and/or a control link exists between the at least two devices.

9. The method of claim 1, wherein the leakage detection device is an integrated device with leakage detection functionality and one or more other functionalities besides leakage detection.

10. The method of claim 1, further comprising detecting, with the leakage detection device, downstream leakage from the cable network.

11. The method of claim 10, wherein the step of detecting downstream leakage is performed simultaneously with detection of the signals from the cable upstream spectrum.

12. The method of claim 11, wherein the signals from the cable upstream spectrum comprise OUDP burst signals.

13. The method of claim 1, wherein the plurality of household cable modems transmit the signals in a round-robin and time-sequenced manner.

14. The method of claim 1, wherein the plurality of household cable modems transmit the signals with each modem transmitting on a unique frequency.

15. The method of claim 1, wherein the household cable modems comprise DOCSIS standard modems.

16. The method of claim 1, wherein the signals configured for a special use purpose comprise a continuous signal type.

17. The method of claim 1, wherein the signals configured for a special use purpose comprise a non-continuous signal type.

18. The method of claim 1, wherein the signals include a modulated signal type.

19. The method of claim 1, wherein the signals include a non-modulated signal type.

20. The method of claim 1, further comprising repairing identified leakage sites in any portion of the cable network including both the drop side and network side.

21. A method of cable network leakage detection, comprising identifying one or more leakage locations when signals configured for a special use purpose which were transmitted from a plurality of household cable modems directly into a cable upstream spectrum and which were subject to time sequencing control by a controlling device are detected with a leakage detection device arranged in a moving vehicle in over-the-air spectrum when the vehicle is in range of one or more leakage sources; and finding the one or more leakage sources at the one or more leakage locations when the signals are detected in over-the-air spectrum and without using detection time stamps.

22. The method of claim 21, wherein the leakage detection device comprises at least two devices which are separate or separable, the at least two devices comprising a first device which is a leakage detector and a second device configured to perform one or more other measurement functions besides leakage detection, wherein a data communication and/or a control link exists between the at least two devices.

23. The method of claim 21, wherein the leakage detection device is an integrated device with leakage detection functionality and one or more other functionalities besides leakage detection.

24. The method of claim 21, further comprising detecting, with the leakage detection device, downstream leakage from the cable network.

25. The method of claim 24, wherein the step of detecting downstream leakage is performed simultaneously with detection of the signals from the cable upstream spectrum.

26. The method of claim 25, wherein the signals from the cable upstream spectrum comprise OUDP burst signals.

27. The method of claim 21, further comprising measuring over-the-air spectrum in search of the signals configured for the special use purpose.

28. The method of claim 21, wherein the signals configured for a special use purpose are pilot tones and/or subcarriers and/or the spectral content of subcarriers.

29. The method of claim 28, wherein the pilot tones and/or subcarriers and/or spectral content are contained within OFDMA (Orthogonal Frequency Division Multiple Access) signaling.

30. The method of claim 29, wherein the OFDMA signals are OUDP burst signals.

* * * * *